(12) United States Patent
Johnson et al.

(10) Patent No.: US 6,756,807 B2
(45) Date of Patent: Jun. 29, 2004

(54) MODULAR ATE POWER SUPPLY ARCHITECTURE

(75) Inventors: Gerald H. Johnson, Andover, MN (US); Michael F. Taylor, Minneapolis, MN (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 10/006,523

(22) Filed: Nov. 30, 2001

(65) Prior Publication Data

US 2003/0102870 A1 Jun. 5, 2003

(51) Int. Cl.[7] .............................................. G01R 31/36
(52) U.S. Cl. .................................................. 324/771
(58) Field of Search ................................ 324/771, 765, 324/713, 537, 158.1, 416; 323/280, 272, 312; 307/219; 327/530, 315

(56) References Cited

U.S. PATENT DOCUMENTS

| | | | | |
|---|---|---|---|---|
| 4,035,715 A | * | 7/1977 | Wyman et al. | ................. 323/4 |
| 4,924,170 A | * | 5/1990 | Henze | ......................... 323/272 |
| 5,936,450 A | * | 8/1999 | Unger | ......................... 327/237 |
| 6,005,773 A | * | 12/1999 | Rozman et al. | ............. 361/707 |

* cited by examiner

Primary Examiner—N. Le
Assistant Examiner—Amy He
(74) Attorney, Agent, or Firm—Lance Kreisman

(57) ABSTRACT

A modular power supply architecture for automatic test equipment is disclosed. The power supply architecture includes a control module having a control signal output line and a plurality of output modules. The control module includes control circuitry to generate a control signal along the control signal output line and measurement circuitry coupled to the control signal output line. The output modules have respective control inputs coupled in parallel to the control signal output line to receive the control signal and respective current outputs connected in parallel. The output modules are operative in response to the control signal to generate respective currents at the current outputs. A current output bus receives and sums the respective current outputs, the output bus being isolated from the control signal line.

15 Claims, 3 Drawing Sheets

MODULAR ATE POWER SUPPLY ARCHITECTURE

FIELD OF THE INVENTION

The invention relates generally to automatic test equipment and more particularly a device-under-test (DUT) power supply for use with a semiconductor tester.

BACKGROUND OF THE INVENTION

Automatic test equipment (ATE) provides the ability for semiconductor device manufacturers to test each and every device fabricated. This enables the manufacturer to prevent defective devices from entering the marketplace, thereby maximizing quality and reliability. Not surprisingly, this correspondingly translates to higher product revenues. With the complexity and sophistication of todays modern semiconductor devices, ATE in a semiconductor manufacturing plant is a necessity in order for the manufacturer to remain competitive.

Conventional ATE typically provides power supplies to supply power to a device-under-test (DUT). Given that a semiconductor tester may be used to test a wide range of devices, the current required may vary over a wide range. Further, there may be cases where a tester user may want to test several devices in parallel. This combination of requirements is frequently addressed by designing a number of power supplies, each having the ability to generate some small current. These supplies are often designed so they can be paralleled to produce a smaller number of higher power supplies.

Paralleling a large number of power supplies often encounters several problems, including unequal current sharing, inaccuracies in summed current measurements and current clamping, and undesirable circuit complexities at the power supply output. Because accuracy requirements for DUT power supplies are generally couched in terms of output voltage and current, minimizing any adverse effects at the output is highly desirable.

What is needed and heretofore unavailable is a high-accuracy device power supply for ATE applications capable of addressing the paralleling problems noted above. The modular ATE power supply architecture of the present invention satisfies this need.

SUMMARY OF THE INVENTION

The modular ATE power supply architecture of the present invention provides a modular way to scale the output of a DUT power supply with minimal circuit complexity in the output stages. This allows for straightforward parallel configurations that are easily controllable and highly accurate.

To realize the foregoing advantages, the invention in one form comprises a modular power supply architecture for automatic test equipment. The power supply architecture includes a control module having a pair of control signal output lines and a plurality of output modules. The control module includes control circuitry to generate control signals along the control signal output lines and measurement circuitry coupled to the control signal output lines. The output modules have respective control inputs coupled in parallel to the control signal output line to receive the control signals and respective current outputs connected in parallel. The output modules are operative in response to the control signals to generate respective currents at the current outputs. A current output bus receives and sums the respective current outputs, the output bus being isolated from the control signal line.

In another form, the invention comprises a method of supplying power to a device-under-test. The method includes the steps of selecting a control module comprising control circuitry for generating respective sink and source control signals along respective source and sink control lines; paralleling a plurality of output current modules to receive the sink and source control signals from the respective source and sink control lines; summing the output currents from the output current modules to an output current bus; and isolating the output current bus from the control circuitry. Any control section can drive any number of output sections, said output sections may or may not be of equal current capability. The total output current capability of the power supply created by the combination of elements is just the total of the paralleled output sections, and the total transconductance is the sum of transconductances of those output sections.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Automatic test equipment DUT power supplies often need to operate according to stringent output voltage and current specifications. Deviations from a manufacturer's requirements may cause failures, or pass devices improperly. Not surprisingly, DUT power supply designs have tended toward more complex circuitry, often resulting in undesirable effects at the power supply output. The present invention minimizes problems at the output by providing a modular, scalable solution to DUT power supply constructions.

Figure 1:
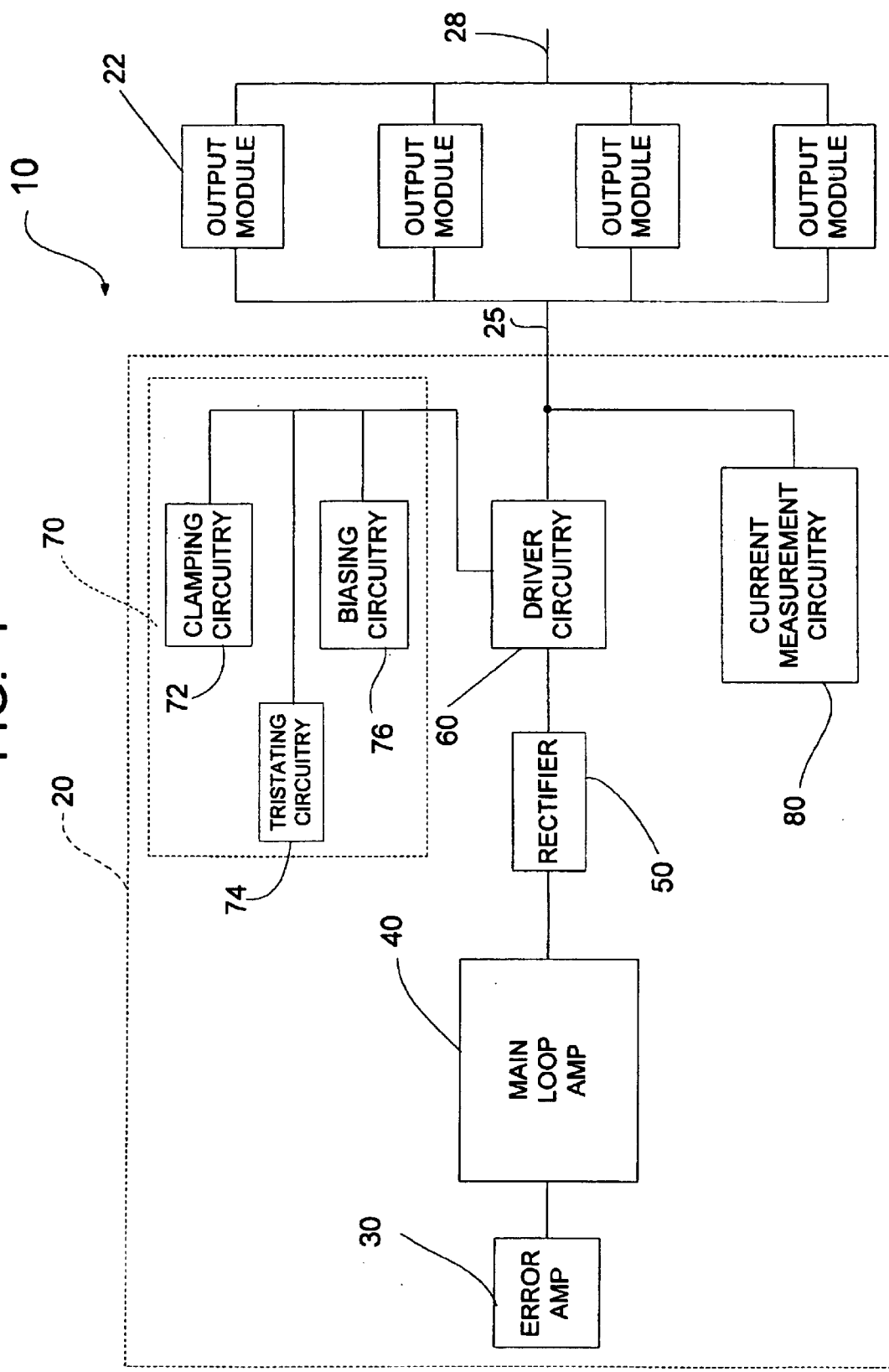
FIG. 1 is a simplified block diagram of a modular ATE power supply architecture according to one form of the present invention.

Referring now to FIG. 1, the DUT power supply of the present invention, generally designated 10, includes a control module 20 (in phantom) for generating a control signal along a control signal line 25. A plurality of output modules 22 are disposed in parallel to receive the control signal, and produce a summed current along an output current bus 28. The current bus is isolated from the control module, thereby minimizing undesirable effects on the output current.

Further referring to FIG. 1, the control module 20 generally includes an error amplifier 30 for generating an error control signal proportional to the difference between the actual differential voltage sensed across the power supply's load and the reference voltage. A main loop amplifier 40 is coupled to the error amplifier output to boost the control signal. A rectifier 50 receives the signal from the main loop amplifier and determines whether the signal requires a "source" (supply current to the DUT) or "sink" (draw current from the DUT) action. The resulting source or sink control signal from the rectifier is fed to driver circuitry 60 where it is further conditioned for transmission along the control signal line 25.

The control module 20 also includes circuitry traditionally disposed at the output of the current output modules, including conditioning circuitry 70 and current measurement circuitry 80. The conditioning circuitry generally includes clamping circuitry 72, tri-stating circuitry 74 and biasing circuitry 76. The current measurement circuitry monitors the level of the control signal that corresponds to the output current sourced or sunk at the current bus 28. This indirect current scheme is highly beneficial in minimizing loads and circuit complexity on the high current bus path.

Figure 2:
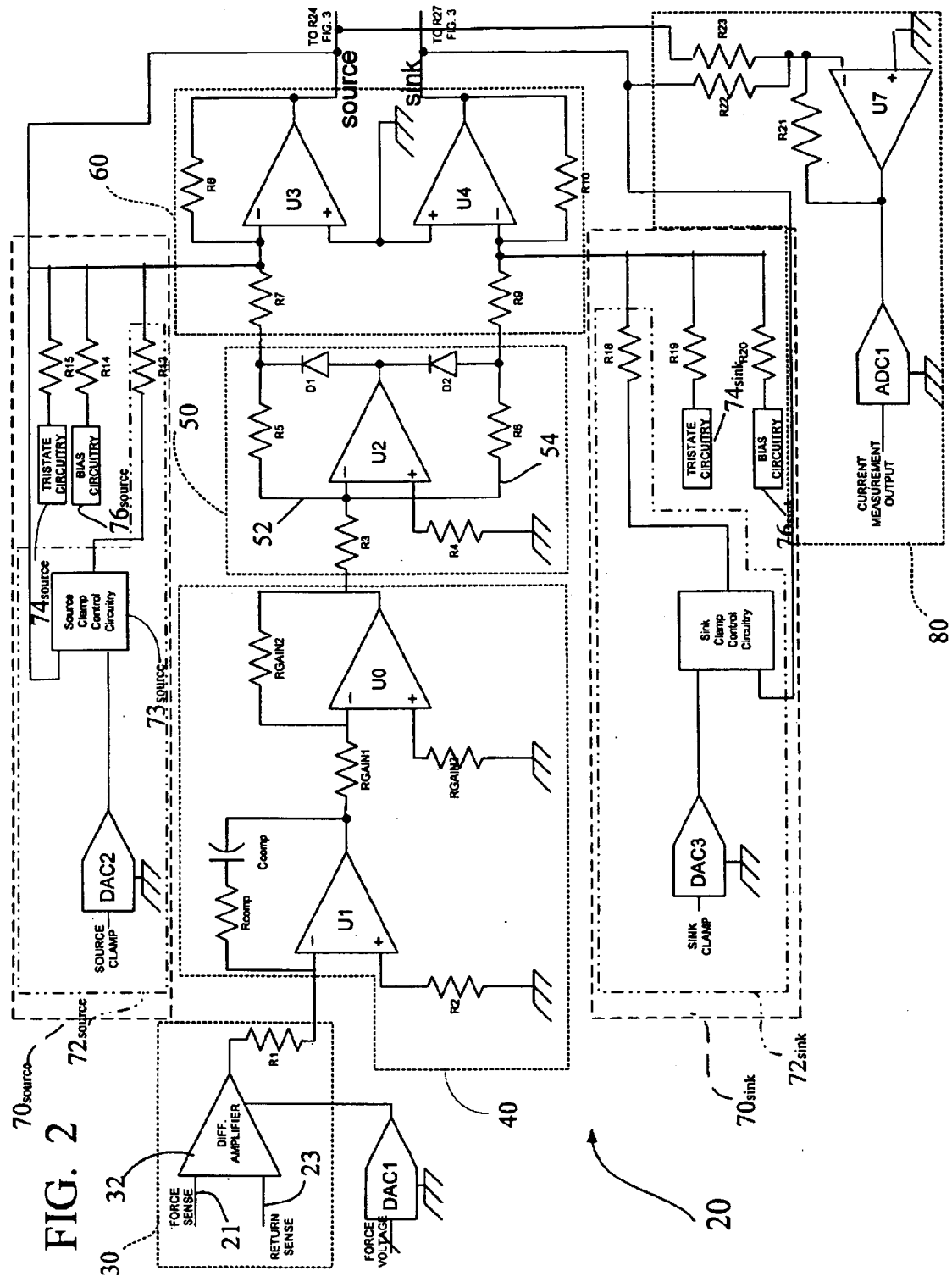
FIG. 2 is a more detailed partial block diagram of the control circuitry of FIG. 1.

Referring now to FIG. 2, which illustrates the circuitry of FIG. 1 in finer detail, the error amplifier 30 comprises a differential amplifier 32 with an output resistance R1. One input of the amplifier is coupled to the positive (force) sense line 21, and the other input coupled to the negative sense line 23, both sense lines connected across the power supply's load at the load itself. A digital-analog-converter DAC1 provides the error amplifier with an analog reference voltage corresponding to the desired digitally programmed power supply output voltage setting.

The main loop amplifier circuit 40 includes an operational amplifier U1 having an inverting (−) input disposed at the output of the error amplifier circuit 30. A series connection of resistor $R_{comp}$ and capacitor $C_{comp}$ forms a negative feedback path for a pre-set linear compensation depending on the values of $R_{comp}$ and $C_{comp}$, as is well known in the art. A gain amplifier U0 disposed at the output of the amplifier U1 boosts the output signal proportional to gain resistors RGAIN1 and RGAIN2.

The rectifier 50 includes an op-amp U2 biased by resistors R3 and R4, and having respective source and sink signal paths 52 and 54. The source signal path includes resistor R5 while the sink signal path includes resistor R6. The paths are selectively activated by oppositely disposed diodes D1 and D2 having anode and cathode respectively connected to the op amp U2 output, and cathode and anode respectively tied to the respective resistors. The source and sink signal paths feed the driver circuitry 60 comprising respective source and sink drivers U3 and U4. Each driver has respective gain resistors R7, R8 and R9, R10 for defining the driver gain for the signals fed to the respective source or sink current drive paths SOURCE and SINK.

With continued reference to FIG. 2, the conditioning circuitry 70 taps into the driver circuitry input to provide several functions, including clamping, tri-stating, and biasing of the drivers. As alluded to above, this circuitry is often provided in the output stage circuitry in conventional constructions for various reasons. The inventors have discovered, however, that by keeping the conditioning circuitry separate from the output modules and in the control module 20, then the output modules may be straightforwardly paralleled in a scalable manner, resulting in added accuracy at the current output. It also provides greatly simplified circuitry in the high current path, which reduces size, cost and heat generation. Heat generation can cause a decrease in the current measurement accuracy due to thermal drift of passive and active components.

The conditioning circuitry 70 comprises respective source and sink paths $72_{source}$ and $72_{sink}$. For purposes of clarity, only the source path will be described herein. The path includes respective tristate and bias circuits $74_{source}$ and $76_{source}$ coupled to the driver inverting input through resistors R15 and R14. The clamping circuitry $72_{source}$ takes the form of a digital-analog-converter DAC2 that feeds a clamping voltage to a source clamp control circuit $73_{source}$. The sink path $72_{sink}$ is formed similar to the source path.

Further referring to FIG. 2, the inventors have also discovered that indirectly monitoring the current output of the power supply by detecting the source and sink control signal levels provides favorable results without loading the current output bus 28 (FIG. 1). In this regard, the current monitoring circuitry includes respective sink and source control current resistors R22 and R23 disposed in parallel and serially coupled to resistor R21 to form a summing junction at the inverting input of U7, which is then amplified and presented to the output of the op amp U7. The output feeds an analog-to-digital converter ADC1 to provide a digital representation of the detected current signal.

It's important to note that the control loop circuitry (the error amplifier 30, main loop amplifier circuit 40, rectifier 50 and driver circuitry 60) and the conditioning circuitry 70 (including the clamping circuitry 72, bias circuitry 76 and tri-stating circuitry 74) all play a role in developing the control signal applied to the source or sink control signal lines SOURCE and SINK. Thus, a host of functions are realized in the control module by merely fine-tuning the source or sink control signal levels.

Figure 3:
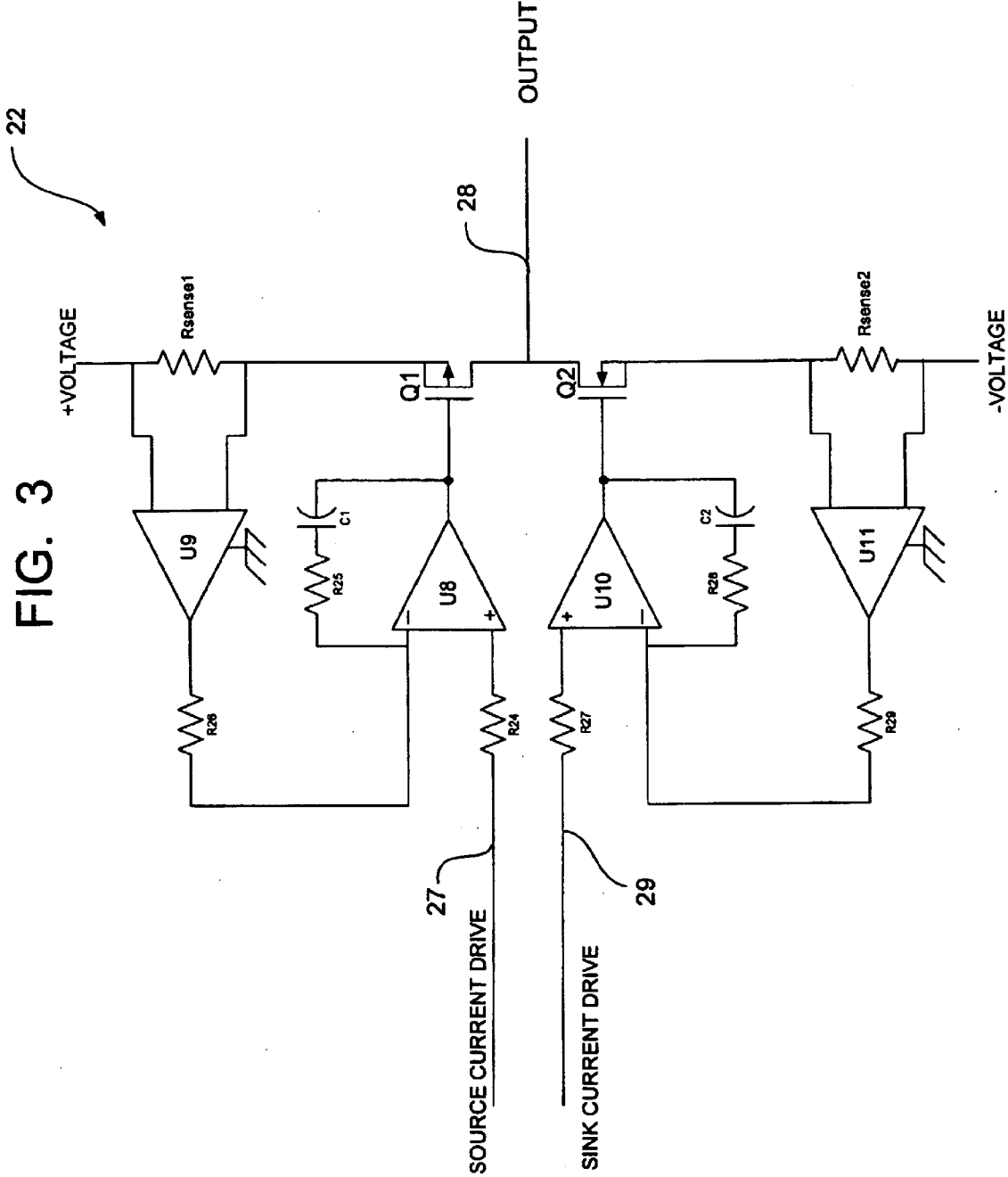
FIG. 3 is a block diagram similar to FIG. 2 showing one output stage for use in the modular ATE power supply architecture.

Referring now to FIG. 3, by employing all of the control circuitry into one control module 20, the output modules 22 may be simplified to provide optimal scalability and accuracy. Each output module includes respective source and sink paths 27 and 29, with only the source path described herein for clarity purposes.

The centerpiece of the output stage source path 27 is a transconductance output amplifier Q1, preferably in the form of a field-effect-transistor. A supply voltage +VOLTAGE is provided through a sense resistor $R_{sense1}$ to establish a current path through the amplifier to the output bus 28. The current level across the sense resistor is monitored by a differential amplifier U9, which provides a feedback signal through resistor R26 to a loop amplifier U8. The loop amplifier includes respective inputs for the feedback signal and the source current drive signal to appropriately drive the output amplifier Q1. Compensation components including resistor R25 and capacitor C1 smooth the control capability of the loop amplifier as required. As noted above, the output stage sink path 29 is formed similar to the source path.

In operation, the force signal converter DAC1 provides the desired supply voltage level to the error amplifier circuit 30. Changes in current demand by the DUT 14 are sensed along the sense lines 21 and 23 to the inputs of the error amplifier 32, and the actual level compared to the desired level. The difference is then fed to the main loop amplifier circuit 40. The main loop amplifier circuit 40 acts on the error signal to provide the pre-set level of linear compensation defined by the values of Rcomp and Ccomp. The resulting signal is then fed through to the rectifier 52 and directed along either the source or sink signal path 64 or 66, depending on the signal polarity.

The driver circuitry 60 then acts on the rectified signal to drive it along either the source current control line 27 or sink current control line 29, subject to settings determined by the tristating circuitry 74, the bias circuitry 76, and the clamping circuitry 72.

The source or sink control signal is then fed to the parallel array of output stage modules 22, to generate or draw current to or from the DUT (not shown). Of particular note is the fact that the entire array of output modules may be controlled by the pair of control lines. This is enabled by employing all of the control circuitry in the control module 20. Because each stage has a particular transconductance (amperes per volt) associated with it, stages may be added or deleted as desired to fit the particular DUT being tested.

Those skilled in the art will appreciate the many benefits and advantages afforded by the present invention. Of significant importance is the ability to control a large number of output stages with a single control module. This allows for minimal circuit complexity at the all-important current output. Additionally, the modular nature of the present invention allows for straightforward adding or deleting of output stage modules as necessary for the desired application, with corresponding scaleability in the current output.

Another beneficial feature realized by the modular nature of the present invention is the ability to implement output modules of any known transconductance without affecting the current measurement location (the control signal lines SOURCE and SINK). Further, the range of voltages measured at the ADC for current measurement remains the same for any combination of output transconductances. The bias is automatically set to the proper level as one parallels more output stage modules. With "N" control modules, "M" output modules, and a crosspoint switch interposed therebetween, one may use any combination of control modules to control any combination of output modules.

While the invention has been particularly shown and described with reference to the preferred embodiments thereof, it will be understood by those skilled in the art that various changes in form and detail may be made therein without departing from the spirit and scope of the invention. For example, while the invention has been described primarily in the context of automatic test equipment, power supply technology has a broad array of applications, including computers and other electronic systems.

What is claimed is:

1. A modular power supply architecture for automatic test equipment including:
   a control module having a control signal output line, the control module including
      control circuitry to generate a control signal along the control signal output line and
      measurement circuitry coupled to the control signal output line;
   a plurality of output modules having respective control inputs coupled in parallel to the control signal output line to receive the control signal and having respective current outputs connected in parallel, the plurality of output modules further comprising respective current sources having high output impedances, the plurality of output modules operative in response to the control signal to generate respective currents at the plurality of current outputs; and
   a current output bus disposed at the plurality of current outputs for summing the respective current outputs, the output bus being isolated from the control signal line.

2. A modular power supply architecture according to claim 1 wherein the control circuitry includes:
   an error amplifier for detecting the difference between a desired power supply output and the actual power supply output, and operative to generate an error signal to correct for the detected difference;
   a main loop amplifier circuit coupled to the output of the error amplifier;
   a rectifier having inputs tied to the main loop amplifier and operative to determine whether the error signal requires source or sink current, the rectifier including source and sink circuitry to generate respective source or sink current control signals; and
   driver circuitry coupled to the rectifier to condition the source or sink current control signals.

3. A modular power supply architecture according to claim 1 wherein the measurement circuitry comprises current measuring circuitry.

4. A modular power supply architecture according to claim 1 and further including:
   conditioning circuitry coupled to the control signal line.

5. A modular power supply architecture according to claim 4 wherein the conditioning circuitry includes:
   biasing circuitry for generating a bias current signal for the plurality of output modules; and
   clamping circuitry for establishing maximum and minimum current levels.

6. A modular power supply architecture according to claim 1 wherein the plurality of output modules comprise respective transconductance amplifier circuits.

7. A modular power supply architecture according to claim 6 wherein each of respective transconductance amplifier circuits includes:
   respective sink and source current paths, each of the sink and source current paths including
      a control amplifier having a feedback input and a control input for receiving the source or sink control signal from the control module,
      an FET current source disposed at the output of the control amplifier, and
      a differential amplifier having input circuitry disposed in the output path of the FET, and operative to generate a feedback signal to the control amplifier.

8. A modular power supply architecture for automatic test equipment including:
   a control module having a control signal output line, the control module including
      control circuitry to generate a control signal along the control signal output line and
      conditioning circuitry coupled to the control signal output line;
   a plurality of output modules having respective control inputs coupled in parallel to the control signal output line to receive the control signal and having respective current outputs connected in parallel, the plurality of output modules further including respective current sources having high output impedances, the plurality of output modules operative in response to the control signal to generate respective currents at the plurality of current outputs; and
   a current output bus disposed at the plurality of current outputs for summing the respective current outputs, the output bus being isolated from the control signal line.

9. A modular power supply architecture according to claim 8 wherein the control circuitry includes:
   an error amplifier for detecting the difference between a desired power supply output and the actual power supply output, and operative to generate an error signal to correct for the detected difference;
   a main loop amplifier coupled to the output of the error amplifier;
   a rectifier having inputs tied to the main loop amplifier and operative to determine whether the error signal requires source or sink current, the rectifier including source and sink circuitry to generate respective source or sink current control signals; and driver circuitry coupled to the rectifier to condition the source or sink current control signals.

10. A modular power supply architecture according to claim 8 and further including:

measurement circuitry coupled to the control signal line.

11. A modular power supply architecture according to claim 10 wherein the measurement circuitry comprises current measuring circuitry.

12. A modular power supply architecture according to claim 8 wherein the conditioning circuitry includes:

biasing circuitry for generating a bias current signal; and clamping circuitry for establishing maximum and minimum current levels.

13. A modular power supply architecture according to claim 8 wherein the plurality of output modules comprise respective transconductance amplifier circuits.

14. A modular power supply architecture according to claim 13 wherein each of respective transconductance amplifier circuits includes:

respective sink and source current paths, each of the sink and source current paths including a control amplifier having a feedback input and a control input for receiving the source or sink control signal from the control module, an FET current source disposed at the output of the control amplifier, and a differential amplifier having input circuitry disposed in the output path of the FET, and operative to generate a feedback signal to the control amplifier.

15. A method of supplying power to a device-under-test, the method including the steps of:

selecting a control module comprising control circuitry for generating respective sink and source control signals along respective source and sink control lines;

paralleling a plurality of output current modules to receive the sink and source control signals from the respective source and sink control lines, the plurality of output current modules comprising current sources having high output impedances;

summing the output currents from the output current modules to an output current bus; and isolating the output current bus from the control circuitry.

* * * * *